United States Patent
Lyu et al.

(10) Patent No.: US 10,321,422 B2
(45) Date of Patent: Jun. 11, 2019

(54) DATA TRANSMISSION METHOD, DEVICE, AND SYSTEM

(71) Applicant: Huawei Technologies Co., Ltd., Shenzhen, Guangdong (CN)

(72) Inventors: Yongxia Lyu, Beijing (CN); Wen Zhang, Shenzhen (CN); Tong Ji, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 178 days.

(21) Appl. No.: 14/941,187

(22) Filed: Nov. 13, 2015

(65) Prior Publication Data
US 2016/0073368 A1    Mar. 10, 2016

Related U.S. Application Data

(63) Continuation of application No. PCT/CN2013/075715, filed on May 16, 2013.

(51) Int. Cl.
*H04L 1/00*    (2006.01)
*H03M 13/27*    (2006.01)
(Continued)

(52) U.S. Cl.
CPC ......... *H04W 56/001* (2013.01); *H03M 13/27* (2013.01); *H03M 13/2775* (2013.01);
(Continued)

(58) Field of Classification Search
None
See application file for complete search history.

(56) References Cited

U.S. PATENT DOCUMENTS

| 2006/0039271 A1* | 2/2006 | Li ...................... H04W 52/262 370/208 |
| 2011/0044409 A1* | 2/2011 | Yoshimoto ............. H04J 11/004 375/340 |

(Continued)

FOREIGN PATENT DOCUMENTS

| CN | 102300267 A | 12/2011 |
| CN | 102316535 A | 1/2012 |

(Continued)

OTHER PUBLICATIONS

Katsutoshi Kusume et al., "Some Aspects of Interleave Division Multiple Access in Ad Hoc Networks", Turbo-Coding 2006, Apr. 3-7, 2006, 6 pages, XP-002674364.

(Continued)

*Primary Examiner* — Faruk Hamza
*Assistant Examiner* — Alan L Lindenbaum

(57) ABSTRACT

Embodiments of the present invention disclose a data transmission method, device, and system, are applied to the field of communications, and can improve data transmission efficiency and reduce a time delay. The method includes: acquiring, by a sending device, a time-frequency resource and interleaver information that are to be used by to-be-sent data, where the interleaver information includes a correspondence between an interleaver and a time synchronization code, and there is a one-to-one correspondence between a time synchronization code and an interleaver; selecting a time synchronization code and an interleaver for the to-be-sent data according to the interleaver information; and performing interleaving processing on the to-be-sent data by using the selected interleaver, and sending, to a receiving device on the time-frequency resource, the interleaved to-be-sent data that carries the selected time synchronization (Continued)

code. The embodiments of the present invention are applied to data transmission.

21 Claims, 6 Drawing Sheets

(51) Int. Cl.
*H04W 56/00* (2009.01)
*H04W 72/04* (2009.01)

(52) U.S. Cl.
CPC .......... *H04L 1/00* (2013.01); *H04W 72/0446* (2013.01); *H04W 72/0453* (2013.01)

(56) References Cited

U.S. PATENT DOCUMENTS

| | | | |
|---|---|---|---|
| 2011/0182236 A1* | 7/2011 | Matsumoto | H04J 11/004 370/328 |
| 2012/0176975 A1 | 7/2012 | Choi et al. | |
| 2013/0016689 A1* | 1/2013 | Jeong | H04W 74/02 370/329 |
| 2014/0119352 A1* | 5/2014 | Matsumoto | H04L 1/0043 370/337 |

FOREIGN PATENT DOCUMENTS

| | | |
|---|---|---|
| CN | 102957500 A | 3/2013 |
| EP | 1 775 840 A1 | 4/2007 |
| JP | H11298439 | 10/1999 |
| JP | 2011155588 A | 8/2011 |
| JP | 2012253600 A | 12/2012 |

OTHER PUBLICATIONS

Li Ping et al, "The OFDM-IDMA Approach to Wireless Communication Systems", IEEE Wireless Communications, Jun. 2007, p. 18-24.

Katsutoshi Kusume et al., "A Multiuser Detection Perspective on Medium Access Control in Ad Hoc Networks", Nov. 1, 2007, p. 801-806.

Nico Franzen, "Advanced Aloha with SIC for Beaconing in a MANET", May 15, 2011, 5 pages.

A. Mary Juliet et al., "Design Analysis of Deterministic Interleaver for OFDM-IDMA System", 2013 International Conference on Signal Processing, Image Processing and Pattern Recognition, Feb. 7, 2013, 5 pages.

Matsumoto et al., The Institute of Electronics, Information and Communication Engineers, Proceedings 1 of the 2012 IEICE Society Conference, Sep. 2012, p. 375, B-5-11.

Performance Evaluation of IDMA for Small Packet Transmission, The Institute of Electronics, Information and Communication Engineers, IEICE Technical Reports, Mar. 2012, p. 157-162, RCS2011-342.

Manoj Shukla et al.,"Analysis of Optimum Interleaver for Receivers in IDMA Systems", Springer,V. Garg, R. Wattenhofer, and K. Kothapalli (Eds.): ICDCN 2009, LNCS 5408, Jan. 3, 2009, pp. 400-407, XP047403380.

* cited by examiner

DATA TRANSMISSION METHOD, DEVICE, AND SYSTEM

CROSS-REFERENCE TO RELATED APPLICATIONS

This application is a continuation of International Application No. PCT/CN2013/075715, filed on May 16, 2013, which is hereby incorporated by reference in its entirety.

TECHNICAL FIELD

The present invention relates to the field of communications, and in particular, to a data transmission method, device, and system.

BACKGROUND

In current LTE (Long Term Evolution, Long Term Evolution), data is transmitted in a manner that is based on a connection. In the prior art, for a small data packet for M2M (Machine to Machine), it is required that data is transmitted each time only after a link is established and synchronization is achieved, that is, before data is transmitted, devices that exchange data need to first establish a link, and then start data transmission. This process involves interaction of information that includes 15 pieces of signaling and 1 data packet.

In the foregoing data transmission process, in the prior art, a large amount of signaling interaction is required in a process of preparing for data transmission (that is in a synchronization processing process of establishing a link); therefore, the prior art is not suitable for a case in which massive devices transmit small data packets, and has problems of low transmission efficiency and severe delay.

SUMMARY

Embodiments of the present invention provide a data transmission method, device, and system, which can reduce signaling overheads, improve data transmission efficiency, and reduce a time delay.

To achieve the foregoing objectives, the following technical solutions are used in the embodiments of the present invention.

According to a first aspect, a data transmission method is provided, including:

acquiring, by a sending device, a time-frequency resource and interleaver information that are to be used by to-be-sent data, where the interleaver information includes a correspondence between an interleaver and a time synchronization code, and there is a one-to-one correspondence between a time synchronization code and an interleaver;

selecting a time synchronization code and an interleaver for the to-be-sent data according to the interleaver information; and performing interleaving processing on the to-be-sent data by using the selected interleaver, and sending, to a receiving device on the time-frequency resource, the interleaved to-be-sent data that carries the selected time synchronization code.

In a first possible implementation manner, with reference to the first aspect, the acquiring, by a sending device, a time-frequency resource and information about all available interleavers that are to be used by to-be-sent data includes:

acquiring, by the sending device by using a system broadcast message or a dedicated signaling notification, or according to a pre-configuration, the time-frequency resource to be used by the to-be-sent data; and acquiring, by the sending device by using a system broadcast message or a dedicated signaling notification, or according to a pre-configuration, the interleaver information to be used by the to-be-sent data.

In a second possible implementation manner, with reference to the first aspect, the selecting a time synchronization code and an interleaver for the to-be-sent data according to the interleaver information includes:

selecting the time synchronization code and the interleaver according to identifier information of the sending device and the interleaver information, where the identifier information of the sending device corresponds to a unique interleaver and a unique time synchronization code.

In a third possible implementation manner, with reference to the second possible implementation manner, the to-be-sent data includes the identifier information of the sending device.

In a fourth possible implementation manner, with reference to the second or third possible implementation manner, the identifier information includes one or more of a cell radio network temporary identifier C-RNTI of the sending device, a Media Access Control MAC address acquired in a process of establishing a connection by the sending device and the receiving device, time information of the to-be-sent data, and an identifier of a fixed time-frequency resource to be used by the to-be-sent data.

In a fifth possible implementation manner, with reference to the first aspect and any one of the possible implementation manners of the first aspect, the to-be-sent data further includes a guard time interval.

According to a second aspect, a data transmission method is provided, including:

receiving, by a receiving device on a pre-configured time-frequency resource, sent data that is sent by a sending device and that carries a time synchronization code; and invoking, according to pre-configured interleaver information, an interleaver corresponding to the time synchronization code to de-interleave the sent data, where the interleaver information includes a correspondence between an interleaver and a time synchronization code, and there is a one-to-one correspondence between a time synchronization code and an interleaver.

In a first possible implementation manner, with reference to the second aspect, before the receiving, by a receiving device on a pre-configured time-frequency resource, sent data that is sent by a sending device, is interleaved, and carries a time synchronization code, the method includes:

notifying, by the receiving device by using a system broadcast message or a dedicated signaling notification, the sending device of a time-frequency resource allocated to the sending device; and notifying, by the receiving device, the sending device of the interleaver information by using a system broadcast message or a dedicated signaling notification.

In a second possible implementation manner, with reference to the second aspect, when the sent data includes identifier information of the sending device, the identifier information of the sending device corresponds to a unique interleaver and a unique time synchronization code; and after the invoking, according to pre-configured interleaver information, an interleaver corresponding to the time synchronization code to de-interleave the sent data, the method further includes: determining, by the receiving device according to the identifier information of the sending device, the sending device corresponding to the sent data.

In a third possible implementation manner, with reference to the second possible implementation manner, the identifier information includes one or more of a cell radio network temporary identifier C-RNTI of the sending device, a Media Access Control MAC address acquired in a process of establishing a connection by the sending device and the receiving device, time information of the sent data, and an identifier of a fixed time-frequency resource used by the sent data.

In a fourth possible implementation manner, with reference to the second aspect and any one of the possible implementation manners of the second aspect, when the sent data further includes a guard time interval, the method further includes:

performing, after the guard time interval, de-interleaving processing on next sent data to be received.

According to a third aspect, a sending device is provided, including:

an acquiring unit, configured to acquire a time-frequency resource and interleaver information that are to be used by to-be-sent data, where the interleaver information includes a correspondence between an interleaver and a time synchronization code, and there is a one-to-one correspondence between a time synchronization code and an interleaver;

a configuration unit, configured to select a time synchronization code and an interleaver for the to-be-sent data according to the interleaver information acquired by the acquiring unit; and a sending unit, configured to perform interleaving processing on the to-be-sent data by using the interleaver selected by the configuration unit, and send, to a receiving device on the time-frequency resource acquired by the acquiring unit, the interleaved to-be-sent data that carries the selected time synchronization code.

In a first possible implementation manner, with reference to the third aspect, the acquiring unit is specifically configured to:

acquire, by using a system broadcast message or a dedicated signaling notification, or according to a pre-configuration, the time-frequency resource to be used by the to-be-sent data; and acquire, by using a system broadcast message or a dedicated signaling notification, or according to a pre-configuration, the interleaver information to be used by the to-be-sent data.

In a second possible implementation manner, with reference to the third aspect, the configuration unit is specifically configured to select the time synchronization code and the interleaver according to identifier information of the sending device and the interleaver information sent by the acquiring unit, where the identifier information of the sending device corresponds to a unique interleaver and a unique time synchronization code.

In a third possible implementation manner, with reference to the second possible implementation manner, the to-be-sent data includes the identifier information of the sending device.

In a fourth possible implementation manner, with reference to the second or third possible implementation manner, the identifier information includes one or more of a cell radio network temporary identifier C-RNTI of the sending device, a Media Access Control MAC address acquired in a process of establishing a connection by the sending device and the receiving device, time information of the to-be-sent data, and an identifier of a fixed time-frequency resource to be used by the to-be-sent data.

In a fifth possible implementation manner, with reference to the third aspect and any one of the possible implementation manners of the third aspect, the to-be-sent data further includes a guard time interval.

According to a fourth aspect, a receiving device is provided, including:

a receiving unit, configured to receive, on a pre-configured time-frequency resource, sent data that is sent by a sending device and that carries a time synchronization code; and a de-interleaving unit, configured to invoke, according to pre-configured interleaver information, an interleaver corresponding to the time synchronization code to de-interleave the sent data received by the receiving unit, where the interleaver information includes a correspondence between an interleaver and a time synchronization code, and there is a one-to-one correspondence between a time synchronization code and an interleaver.

In a first possible implementation manner, with reference to the fourth aspect, the receiving device further includes: a sending unit, configured to notify, by using a system broadcast message or a dedicated signaling notification, the sending device of a time-frequency resource allocated to the sending device; and notify the sending device of the interleaver information by using a system broadcast message or a dedicated signaling notification.

In a second possible implementation manner, with reference to the fourth aspect, the receiving device further includes: an identification unit, configured to: when the sent data includes identifier information of the sending device, determine, according to the identifier information of the sending device, the sending device corresponding to the sent data.

In a third possible implementation manner, with reference to the fourth aspect and any one of the possible implementation manners of the fourth aspect, when the sent data further includes a guard time interval, the de-interleaving unit is further configured to perform, after the guard time interval, de-interleaving processing on next sent data to be received.

According to a fifth aspect, a sending device is provided, including: at least one processor, memory, transmitter, and bus, where the at least one processor, memory, and transmitter are connected and communicate with each other by using the bus, and the memory is configured to store program code; and the processor is configured to acquire a time-frequency resource and interleaver information that are to be used by to-be-sent data, where the interleaver information includes a correspondence between an interleaver and a time synchronization code, and there is a one-to-one correspondence between a time synchronization code and an interleaver;

the processor is configured to select a time synchronization code and an interleaver for the to-be-sent data according to the interleaver information; and the processor is configured to perform interleaving processing on the to-be-sent data by using the selected interleaver, and send, to a receiving device on the time-frequency resource by using the transmitter, the interleaved to-be-sent data that carries the selected time synchronization code.

In a first possible implementation manner, with reference to the fifth aspect, the sending device further includes a receiver connected to the bus, and the processor is specifically configured to:

acquire, by using a system broadcast message received by the receiver or a dedicated signaling notification received by the receiver, or according to a pre-configuration of the processor, the time-frequency resource to be used by the to-be-sent data; and acquire, by using a system broadcast message received by the receiver or a dedicated signaling notification received by the receiver, or according to a pre-configuration of the processor, the interleaver information to be used by the to-be-sent data.

In a second possible implementation manner, with reference to the fifth aspect, the processor is specifically configured to select the time synchronization code and the interleaver according to identifier information of the sending device and the interleaver information, where the identifier information of the sending device corresponds to a unique interleaver and a unique time synchronization code.

In a third possible implementation manner, with reference to the second possible implementation manner, the to-be-sent data includes the identifier information of the sending device.

In a fourth possible implementation manner, with reference to the second or third possible implementation manner, the identifier information includes one or more of a cell radio network temporary identifier C-RNTI of the sending device, or a Media Access Control MAC address acquired in a process of establishing a connection by the sending device and the receiving device, or time information of the to-be-sent data, or an identifier of a fixed time-frequency resource to be used by the to-be-sent data.

In a fifth possible implementation manner, with reference to the fifth aspect and any one of the possible implementation manners of the fifth aspect, the to-be-sent data further includes a guard time interval.

According to a sixth aspect, a receiving device is provided, including: at least one processor, memory, receiver, and bus, where the at least one processor, memory, and receiver are connected and communicate with each other by using the bus, and the memory is configured to store program code; and the receiver is configured to receive, on a pre-configured time-frequency resource, sent data that is sent by a sending device and that carries a time synchronization code; and the processor is configured to invoke, according to pre-configured interleaver information, an interleaver corresponding to the time synchronization code to de-interleave the sent data, where the interleaver information includes a correspondence between an interleaver and a time synchronization code, and there is a one-to-one correspondence between a time synchronization code and an interleaver.

In a first possible implementation manner, with reference to the sixth aspect, the receiving device further includes a transmitter connected to the bus, and the transmitter is configured to:

notify, by using a system broadcast message or a dedicated signaling notification, the sending device of a time-frequency resource allocated to the sending device; and notify the sending device of the interleaver information by using a system broadcast message or a dedicated signaling notification.

In a second possible implementation manner, with reference to the sixth aspect, the processor is further configured to: when the sent data includes identifier information of the sending device, determine, according to the identifier information of the sending device, the sending device corresponding to the to-be-sent data.

In a third possible implementation manner, with reference to the sixth aspect and any one of the possible implementation manners of the sixth aspect, when the sent data further includes a guard time interval, the processor is further configured to perform, after the guard time interval, de-interleaving processing on next sent data to be received.

According to a seventh aspect, a data transmission system is provided, including any one of the foregoing sending devices and any one of the foregoing receiving devices.

In the data transmission method, device, and system provided in the embodiments of the present invention, to-be-sent data is sent by selecting a time synchronization code and a corresponding interleaver for the data, and it is unnecessary to first request a resource to establish link synchronization between devices in each data sending process, thereby sending the data in an authorization-free manner, which effectively reduces signaling overheads, improves transmission efficiency, and reduces a time delay.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
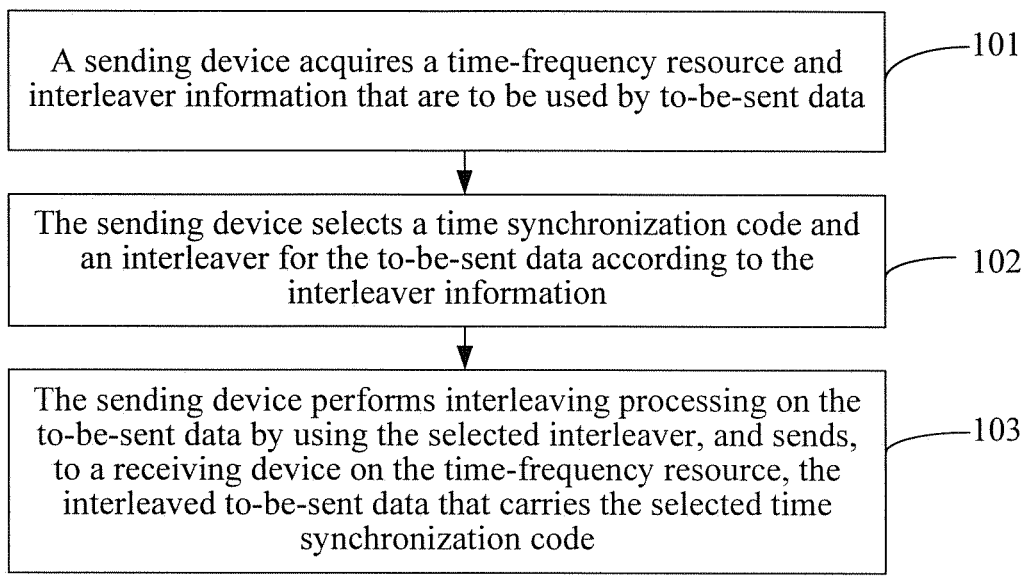
FIG. 1 is a schematic flowchart of a data transmission method according to an embodiment of the present invention.

The embodiments of the present invention are applicable to a data sending format of a multiple access scheme including IDMA (interleave-division multiple-access, interleave-division multiple-access), IDMA+OFDM (IDMA+orthogonal frequency division multiplexing, interleave-division multiple-access and orthogonal frequency division multiplexing), IDMA+OFDMA (IDMA+orthogonal frequency division multiple access, interleave-division multiple-access and orthogonal frequency division multiple access), or IDMA+SC-FDMA (IDMA+Single-carrier Frequency-Division Multiple Access, interleave-division multiple-access and single-carrier frequency-division multiple access), that is, IDMA or a scheme combining IDMA and another multiple access scheme, which is certainly not limited in the embodiments of the present invention, and the IDMA multiple access scheme is used as an example below for description. A data transmission method provided in the embodiments of the present invention is applicable to transmission of a small data packet for M2M in LTE, the method is certainly also applicable to another system such as LTE-A, and only application to LTE is used as an example herein for description but not used as a limitation. On a side of a sending device, specifically, referring to FIG. 1, the method includes the following steps:

101: A sending device acquires a time-frequency resource and interleaver information that are to be used by to-be-sent data, where the interleaver information includes a correspondence between an interleaver and a time synchronization code, and there is a one-to-one correspondence between a time synchronization code and an interleaver.

102: The sending device selects a time synchronization code and an interleaver for the to-be-sent data according to the interleaver information.

Certainly, the interleaver or the time synchronization code herein is randomly configured for the sending device. Because for the time synchronization code and the interleaver, there is a one-to-one correspondence between the time synchronization code and the interleaver, in step 102, it may be considered that the sending device first configures the time synchronization code or first configures the interleaver, and as long as either of the two is determined, the other may be determined according to the correspondence, which is therefore not limited herein in the present invention.

103: The sending device performs interleaving processing on the to-be-sent data by using the selected interleaver, and sends, to a receiving device on the time-frequency resource, the interleaved to-be-sent data that carries the selected time synchronization code.

Certainly, according to an IDMA architecture, in step 103, after the to-be-sent data is encoded by using a general-purpose encoder (ENC, encoder) (the general-purpose encoder may be a forward error correction (FEC, Forward Error Correction) encoder or a spreader spreader, or may be formed by cascading a forward error correction encoder and a spreader), the to-be-sent data is sent to the receiving device by using the selected interleaver. An encoding manner herein exists in the prior art, and is not specifically limited. The encoding manner may certainly be an encoding manner preset by the sending device or an encoding manner sent by the receiving device, and specifically includes QPSK (Quadrature Phase Shift Keying, quadrature phase shift keying) encoding, rate-1/3Turbo encoding, and the like.

Figure 2:
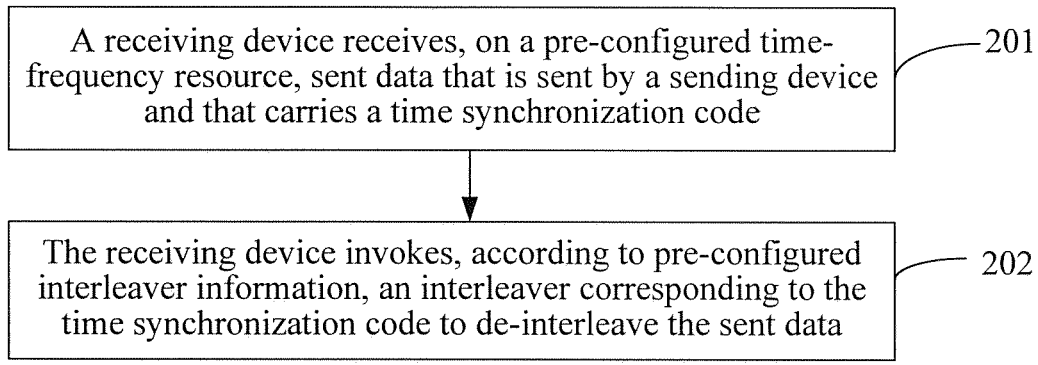
FIG. 2 is a schematic flowchart of another data transmission method according to an embodiment of the present invention.

On a side of a receiving device, referring to FIG. 2, the method includes the following steps:

201: A receiving device receives, on a pre-configured time-frequency resource, sent data that is sent by a sending device and that carries a time synchronization code.

202: The receiving device invokes, according to pre-configured interleaver information, an interleaver corresponding to the time synchronization code to de-interleave the sent data, where the interleaver information includes a correspondence between an interleaver and a time synchronization code, and there is a one-to-one correspondence between a time synchronization code and an interleaver.

In the data transmission method provided in this embodiment of the present invention, to-be-sent data is sent by selecting a time synchronization code and a corresponding interleaver for the data, and it is unnecessary to first request a resource to establish link synchronization between devices in each data sending process, thereby sending the data in an authorization-free manner, which effectively reduces signaling overheads, improves transmission efficiency, and reduces a time delay.

Figure 3:
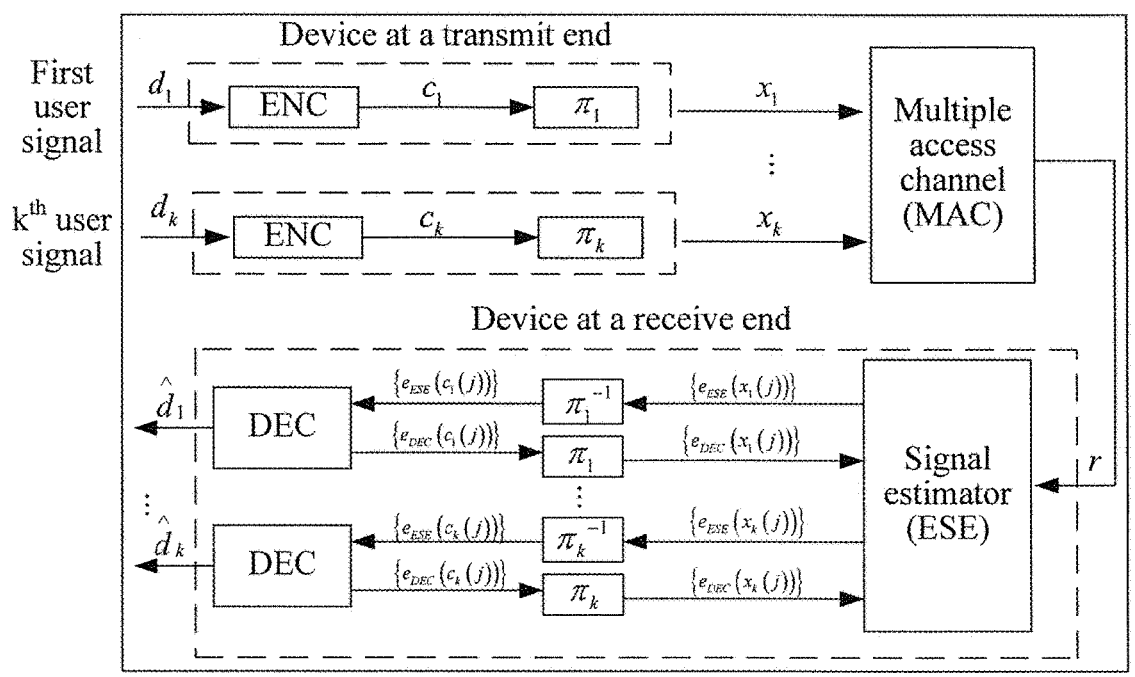
FIG. 3 is a schematic flowchart of a data transmission method according to another embodiment of the present invention.

The technical solutions provided in the embodiments of the present invention are described below with reference to a multiplexing technical solution of IDMA interleave-division multiple-access. First, an embodiment of the present invention provides an IDMA architecture shown in FIG. 3, where a sending device at a data sending end encodes and performs interleaving processing on each piece of user data (that is, each piece of data to be sent by the sending device, namely, the first user signal to the $k^{th}$ user signal in the figure) by using a general-purpose encoder (ENC) and an interleaver $\pi_i$, and sends each piece of user data to a receiving device after an access channel is multiplexed to a signal r. At a data receiving end, the receiving device includes an elementary signal estimator (ESE, elementary signal estimator), a group of de-interleavers, and a group of single-user decoders (DEC, decoder) with a maximum a posteriori probability (AP, posterior probability), where each de-interleaver and each decoder are responsible for de-interleaving and decoding tasks corresponding to one user (sending device). Certainly, only an IDMA decoding architecture is provided herein; and other hybrid multiple-access architectures combining IDMA are also mentioned in the foregoing embodiment, and exist in the prior art and are not described in detail herein.

Figure 4:
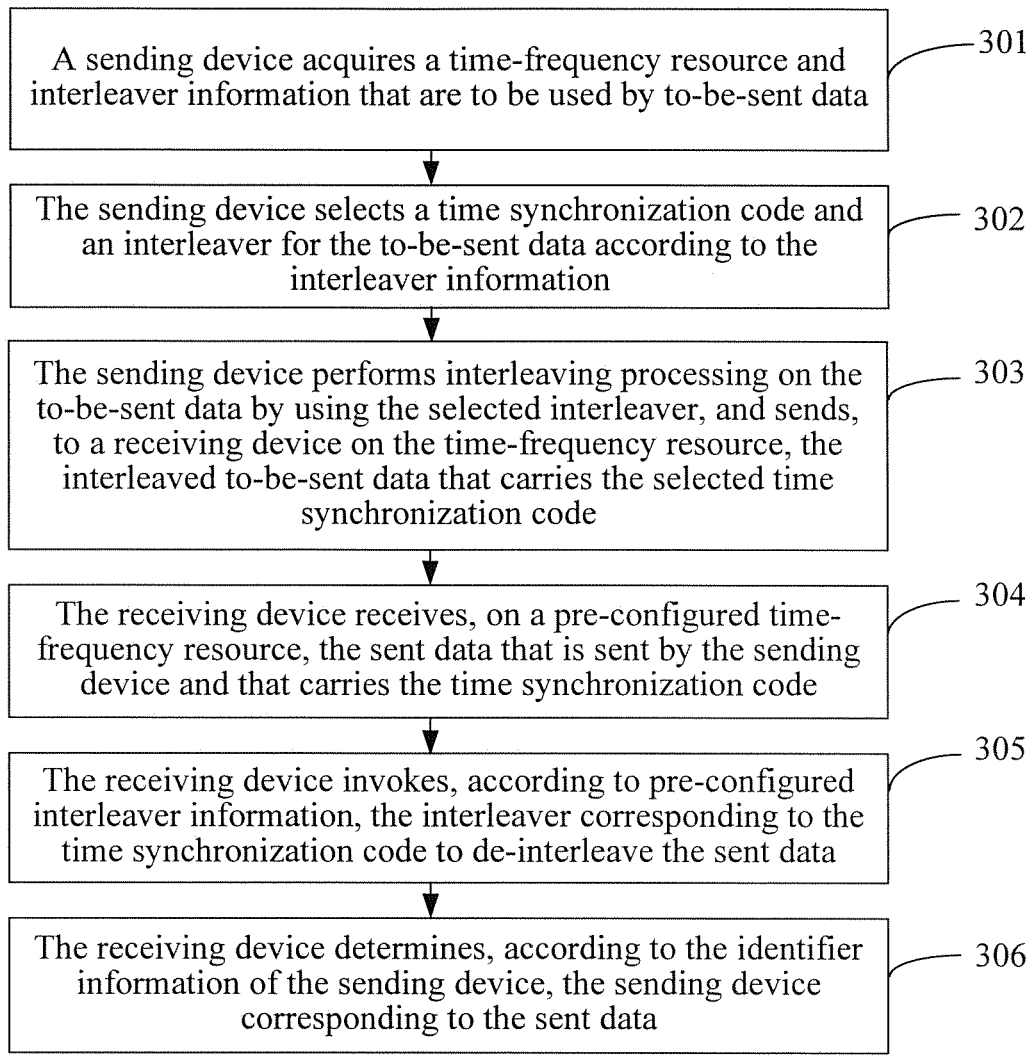
FIG. 4 is a schematic architectural diagram of an IDMA system according to an embodiment of the present invention.

In the foregoing architecture, referring to FIG. 4, the embodiments of the present invention are specifically implemented in the following manner:

301: A sending device acquires a time-frequency resource and interleaver information that are to be used by to-be-sent data, where the interleaver information includes a correspondence between an interleaver and a time synchronization code, and there is a one-to-one correspondence between a time synchronization code and an interleaver.

Optionally, step 301 specifically includes: acquiring, by the sending device by using a system broadcast message or a dedicated signaling notification, or according to a pre-configuration, the time-frequency resource to be used by the to-be-sent data; and acquiring, by the sending device by using a system broadcast message or a dedicated signaling notification, or according to a pre-configuration, the interleaver information to be used by the to-be-sent data.

Specifically, cases in which the following possible combinations appear are included.

The sending device acquires, by using a system broadcast message, a time-frequency resource and interleaver information that are allocated to the sending device.

Alternatively, the sending device receives a dedicated signaling notification, where the dedicated signaling notification includes a time-frequency resource and interleaver information that are allocated to the sending device.

Alternatively, the sending device acquires interleaver information pre-configured by the sending device, and selects, from time-frequency resources preset by the sending device, a time-frequency resource to be used by the to-be-sent data.

Alternatively, the sending device acquires, in a system broadcast message, a time-frequency resource allocated to the sending device, and receives a dedicated signaling notification, where the dedicated signaling notification includes interleaver information allocated to the sending device.

Alternatively, the sending device acquires, in a system broadcast message, interleaver information allocated to the sending device, and receives a dedicated signaling notification, where the dedicated signaling notification includes a time-frequency resource allocated to the sending device.

Alternatively, the sending device acquires interleaver information pre-configured by the sending device, and acquires, in system broadcast message, a time-frequency resource allocated to the sending device.

Alternatively, the sending device selects, from time-frequency resources preset by the sending device, a time-frequency resource to be used by the to-be-sent data, and acquires, in a system broadcast message, interleaver information allocated to the sending device.

Alternatively, the sending device acquires interleaver information pre-configured by the sending device, and receives a dedicated signaling notification, where the dedicated signaling notification includes a time-frequency resource allocated to the sending device.

Alternatively, the sending device selects, from time-frequency resources preset by the sending device, a time-frequency resource to be used by the to-be-sent data, and receives a dedicated signaling notification, where the dedicated signaling notification includes interleaver information allocated to the sending device.

Accordingly, the receiving device notifies, by using a system broadcast message or a dedicated signaling notification, the sending device of a time-frequency resource allocated to the sending device; and the receiving device notifies the sending device of the interleaver information by using a system broadcast message or a dedicated signaling notification.

In this case, the data may be sent on the selected time-frequency resource in a form of a time synchronization code+the data. Further, optionally, referring to the following Table 1, the to-be-sent data further includes a guard time interval, and in this case, data may be sent in a format of a time synchronization code+the data+a character of the guard time GT interval.

| Time synchronization code | Data | GT |
| --- | --- | --- |

In this case, the time synchronization code is randomly selected by the sending device, and the character of the guard time (GT, guard time) for data transmission is added to avoid interference to receiving of next-frame data on a side of the receiving device.

Herein, because there is a one-to-one correspondence between a time synchronization code and an interleaver, the correspondence between a time synchronization code and an interleaver may be shown in Table 2 as follows:

| Time synchronization code | Interleaver |
| --- | --- |
| time synchronization code #0 | interleaver #0 |
| time synchronization code #1 | interleaver #1 |
| time synchronization code #2 | interleaver #2 |
| time synchronization code #3 | interleaver #3 |
| time synchronization code #4 | interleaver #4 |
| time synchronization code #5 | interleaver #5 |
| . . . | . . . |

As described above, the correspondence reflected in Table 2 may be broadcast to the sending device as the interleaver information by using the receiving device, or be notified by using dedicated signaling, or be preset on a side of the sending device.

302: The sending device selects a time synchronization code and an interleaver for the to-be-sent data according to the interleaver information.

Certainly, the interleaver or the time synchronization code herein is randomly configured for the sending device. Because for the time synchronization code and the interleaver, there is a one-to-one correspondence between the time synchronization code and the interleaver, in step 302, it may be considered that the sending device first configures the time synchronization code or first configures the interleaver, and as long as either of the two is determined, the other may be determined according to the correspondence, which is therefore not limited herein in the present invention.

Optionally, the to-be-sent data includes identifier information of the sending device.

The identifier information of the sending device corresponds to a unique interleaver and a unique time synchronization code, and the identifier information includes one or more of a cell radio network temporary identifier C-RNTI (Cell Radio Network Temporary Identifier) of the sending device, a Media Access Control MAC (Media Access Control) address acquired in a process of establishing a connection by the sending device and the receiving device, time information of the to-be-sent data, where the time information herein may certainly include a subframe, a radio frame, a time slot, and the like, and an identifier of a fixed time-frequency resource to be used by the to-be-sent data.

Similar to the data sending format shown in Table 1 and set in step 301, to enable the receiving device to distinguish sending devices and data sent by corresponding sending devices, identifier information of a corresponding sending device may be set in to-be-sent data, where the identifier information may be identifier information that is set in first 16 bits of the to-be-sent data, so that the receiving device identifies the receiving device according to the 16 bits.

In this way, the to-be-sent data includes the identifier information of the sending device. Identifier information of sending devices is different, and in a data sending process, each sending device may select a different time synchronization code and a different interleaver for the sending device according to identifier information of the sending device; therefore, it indicates that there is a one-to-one correspondence between identifiers of an interleaver and a time synchronization code selected by a sending device and identifier information of the sending device. In one cell, identifier information of sending devices is unique and different; therefore, as an interleaver and a time synchronization code are selected at a transmit end according to identifier information of a sending device, different sending devices in the same cell send data by using different interleavers, thereby avoiding collision during data sending.

Certainly, optionally, the to-be-sent data may also not include the identifier information of the sending device, and a time synchronization code and an interleaver are selected only on a side of the sending device according to identifier information of the sending device, so that different sending devices select different interleavers to perform interleaving processing on data, and collision during data sending can also be effectively avoided; however, when the to-be-sent data includes the identifier information of the sending device, the receiving device conveniently identifies the receiving device according to the identifier information.

Similarly, a one-to-one correspondence between identifiers of an interleaver and a time synchronization code that may be selected by the sending device and a set of identifier information of sending devices may also be set. In this case, assuming that a device identifier of the sending device is $n_{ID}$, and an identifier of a time synchronization code corresponding to the device identifier is s, a relationship between $n_{ID}$ and s is: $s=n_{ID}$ mod M, where M is a preset fixed value or a total quantity of available interleavers in a cell. If M=32, all sending devices whose identifiers are 5, 37, 69, . . . use an interleaver in the case of s=5. Further, to enable the receiving device to know a corresponding receiving device, a parameter including a device identifier of a sending device may also be set to identifier information in the to-be-sent data. A parameter K may be set in data of a sending device whose device identifier is $n_{ID}$, so that k=floor($n_{ID}$/M), where floor(x) represents a maximum integer that is not greater than x, for example, for a sending device whose device identifier is 37, data of the sending device should include a parameter "1" (k=floor(37/32)=1). In this way, on a side of the receiving device, a corresponding interleaver may be first determined according to s, and a corresponding sending device is then determined according to k, thereby avoiding data collision.

303: The sending device performs interleaving processing on the to-be-sent data by using the selected interleaver, and sends, to a receiving device on the time-frequency resource, the interleaved to-be-sent data that carries the selected time synchronization code.

Certainly, according to an IDMA architecture, in step 303, after the to-be-sent data is encoded by using a general-purpose encoder (ENC) (the general-purpose encoder may be a forward error correction (FEC) encoder or a spreader, or may be formed by cascading a forward error correction encoder and a spreader), the encoded to-be-sent data is subject to interleaving processing by using the selected interleaver and is sent to the receiving device. A modulation and coding scheme herein exists in the prior art, and is not specifically limited. The modulation and coding scheme may certainly be an encoding manner preset by the sending device or an encoding manner sent by the receiving device, and specifically includes QPSK encoding, 1/3Turbo encoding, and the like.

304: The receiving device receives, on a pre-configured time-frequency resource, the sent data that is sent by the sending device and carries the time synchronization code.

305: The receiving device invokes, according to pre-configured interleaver information, the interleaver corresponding to the time synchronization code to de-interleave the sent data, where the interleaver information includes a correspondence between an interleaver and a time synchronization code, and there is a one-to-one correspondence between a time synchronization code and an interleaver.

Optionally, when the to-be-sent data includes the identifier information of the sending device, the method further includes the following step:

306: The receiving device determines, according to the identifier information of the sending device, the sending device corresponding to the sent data.

Further, optionally, because in step 301, the data format shown in Table 1 includes a character of a guard time GT interval, the receiving device performs, after the guard time interval, de-interleaving processing on next sent data to be received.

In the data transmission method provided in this embodiment of the present invention, to-be-sent data is sent by selecting a time synchronization code and a corresponding interleaver for the data, and it is unnecessary to first request a resource to establish link synchronization between devices in each data sending process, thereby sending the data in an authorization-free manner, which effectively reduces signaling overheads, improves transmission efficiency, and reduces a time delay. In addition, when the to-be-sent data includes identifier information of a sending device, on a side of a receiving device, data of different sending devices can be identified by using different interleavers, corresponding de-interleaving processing is performed, and a possibility that collision occurs in a data transmission process is reduced.

Figure 5:
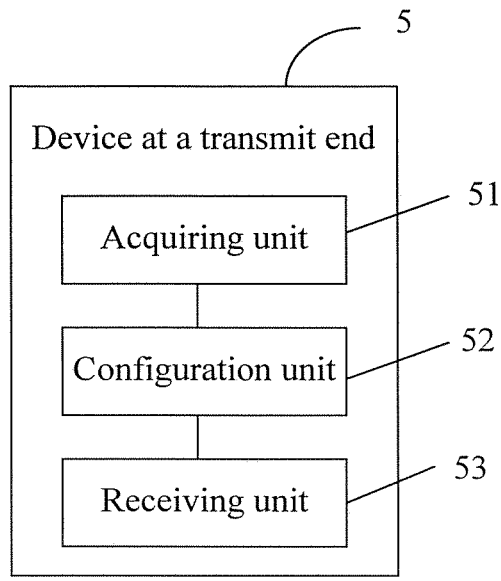
FIG. 5 is a schematic structural diagram of a sending device according to an embodiment of the present invention.

An embodiment of the present invention provides a sending device 5 that is based on an IDMA architecture or a hybrid architecture formed by using IDMA. The sending device is configured to implement the data transmission method provided in the foregoing method embodiment, and the sending device may be a mobile terminal such as a mobile phone, a palmtop computer, or another client device accessing a network such as a personal computer, an enterprise server, or the like. Referring to FIG. 5, the sending device 5 includes: an acquiring unit 51, a configuration unit 52, and a sending unit 53.

The acquiring unit 51 is configured to acquire a time-frequency resource and interleaver information that are to be used by to-be-sent data, where the interleaver information includes a correspondence between an interleaver and a time synchronization code, and there is a one-to-one correspondence between a time synchronization code and an interleaver.

Optionally, the acquiring unit 51 is specifically configured to acquire, by using a system broadcast message or a dedicated signaling notification, or according to a pre-configuration, the time-frequency resource to be used by the to-be-sent data; and acquire, by using a system broadcast message or a dedicated signaling notification, or according to a pre-configuration, the interleaver information to be used by the to-be-sent data.

The configuration unit 52 is configured to select a time synchronization code and an interleaver for the to-be-sent data according to the interleaver information acquired by the acquiring unit 51.

Optionally, the configuration unit 52 is specifically configured to select the time synchronization code or the interleaver according to identifier information of the sending device, where the identifier information of the sending device corresponds to a unique interleaver and a unique time synchronization code, and the identifier information includes one or more of a cell radio network temporary identifier C-RNTI of the sending device, a Media Access Control MAC address acquired in a process of establishing a connection by the sending device and the receiving device, time information of the to-be-sent data, and an identifier of a fixed time-frequency resource to be used by the to-be-sent data. In this way, on a side of the sending device, the time synchronization code or the interleaver is selected according to the identifier information of the sending device, so that different sending devices select different interleavers to perform interleaving processing on data, and collision during data sending can also be effectively avoided.

The sending unit 53 is configured to perform interleaving processing on the to-be-sent data by using the interleaver selected by the configuration unit 52, and send, to a receiving device on the time-frequency resource acquired by the acquiring unit 51, the interleaved to-be-sent data that carries the selected time synchronization code.

In the sending device provided in this embodiment of the present invention, to-be-sent data is sent by selecting a time synchronization code and a corresponding interleaver for the data, and it is unnecessary to first request a resource to establish link synchronization between devices in each data sending process, thereby sending the data in an authorization-free manner, which effectively reduces signaling overheads, improves transmission efficiency, and reduces a time delay.

Further, the to-be-sent data includes the identifier information of the sending device. In this way, on a side of the receiving device, data of different sending devices can be identified by using different interleavers, corresponding de-interleaving processing is performed, and a possibility that collision occurs in a data transmission process is reduced.

Optionally, the to-be-sent data further includes a character of a guard time for data transmission, so that the receiving device performs, after a guard time indicated by the character of the guard time for data transmission, de-interleaving processing on next sent data to be received, which avoids interference to a next frame.

Figure 6:
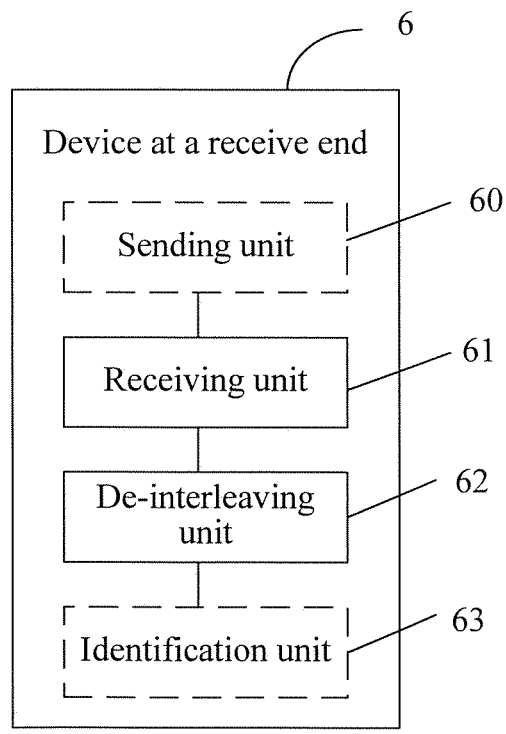
FIG. 6 is a schematic structural diagram of a receiving device according to an embodiment of the present invention.

An embodiment of the present invention provides a receiving device 6 that is based on IDMA or a hybrid architecture formed by using IDMA. The receiving device is configured to implement the data transmission method provided in the foregoing method embodiment, and the receiving device includes: a large base station deployed by an operator, and a small network transceiver node in a closed user group. Referring to FIG. 6, the receiving device 6 includes: a receiving unit 61 and a de-interleaving unit 62, where the receiving unit 61 is configured to receive, on a pre-configured time-frequency resource, sent data that is sent by a sending device and that carries a time synchronization code; and the de-interleaving unit 62 is configured to invoke, according to pre-configured interleaver information, an interleaver corresponding to the time synchronization code to de-interleave the sent data received by the receiving unit 61, where the interleaver information includes a correspondence between an interleaver and a time synchronization code, and there is a one-to-one correspondence between a time synchronization code and an interleaver.

Optionally, referring to FIG. 6, the receiving device further includes a sending unit 60, where the sending unit 60 notifies, by using a system broadcast message or a dedicated signaling notification, the sending device of a time-frequency resource allocated to the sending device; and notifies the sending device of the interleaver information by using a system broadcast message or a dedicated signaling notification.

In the receiving device provided in this embodiment of the present invention, to-be-sent data that is sent by a sending device and that carries a time synchronization code having a one-to-one correspondence with an interleaver is received, and it is unnecessary to first request a resource by using the sending device to establish link synchronization between devices in each data transmission process, thereby sending the data in an authorization-free manner, which effectively reduces signaling overheads, improves transmission efficiency, and reduces a time delay.

Further, optionally, referring to FIG. 6, the receiving device further includes: an identification unit 63 configured to: when the sent data includes identifier information of the sending device, determine, according to the identifier information of the sending device, the sending device corresponding to the sent data.

In this way, on a side of the receiving device, data of different sending devices can be identified by using different interleavers, corresponding de-interleaving processing is performed, and a possibility that collision occurs in a data transmission process is reduced.

Further, optionally, the sent data further includes a guard time interval, and the de-interleaving unit 62 is further configured to perform, after the guard time interval, de-interleaving processing on next sent data to be received, which avoids interference to a next frame.

Figure 7:
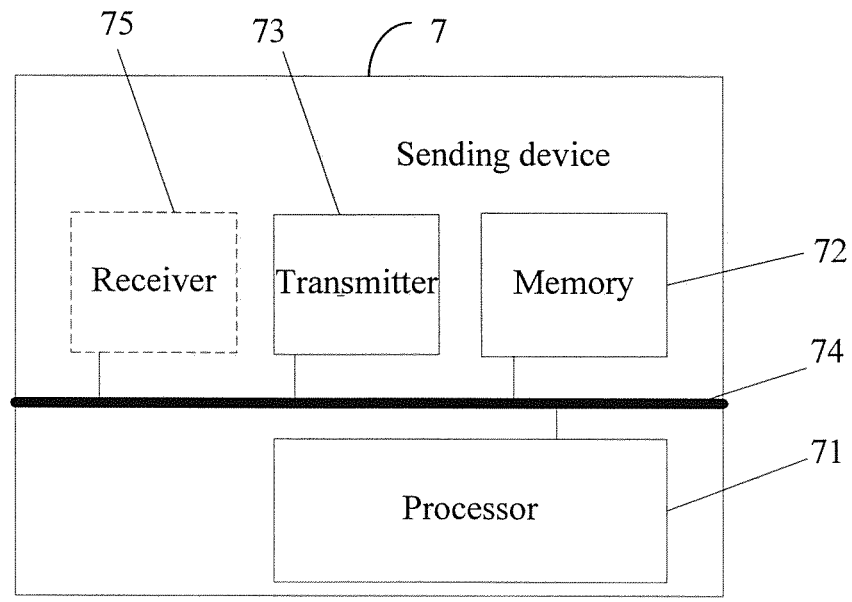
FIG. 7 is a schematic structural diagram of a sending device according to another embodiment of the present invention.

An embodiment of the present invention provides a sending device. Referring to FIG. 7, the sending device includes: at least one processor 71, memory 72, transmitter 73, and bus 74, where the at least one processor 71, memory 72, and transmitter 73 are connected and communicate with each other by using the bus 74, and the memory 72 is configured to store program code.

The bus 74 may be an industry standard architecture (Industry Standard Architecture, ISA for short) bus, a peripheral component interconnect (Peripheral Component Interconnect, PCI for short) bus, an extended industry standard architecture (Extended Industry Standard Architecture, EISA for short) bus, or the like. The bus 74 may be classified into an address bus, a data bus, a control bus, and the like, and is represented by only one thick line in FIG. 7 for ease of representation, which however does not indicate that there is only one bus or one type of buses.

The memory 72 is configured to store executable program code, where the program code includes a computer operation instruction. The memory 72 may include a high-speed RAM memory, or may further include a non-volatile memory (non-volatile memory), for example, at least one magnetic disk storage.

The processor 71 may be a central processing unit (Central Processing Unit, CPU for short), or an application specific integrated circuit (Application Specific Integrated Circuit, ASIC for short) or one or more integrated circuits that are configured to implement this embodiment of the present invention.

The transmitter 73 is mainly configured to implement communication between the sending device and a receiving device in this embodiment.

The processor 71 is further configured to invoke the program code in the memory 72, to perform the following operations.

The processor 71 is configured to acquire a time-frequency resource and interleaver information that are to be used by to-be-sent data, where the interleaver information includes a correspondence between an interleaver and a time synchronization code, and there is a one-to-one correspondence between a time synchronization code and an interleaver;

the processor 71 is configured to select a time synchronization code and an interleaver for the to-be-sent data according to the interleaver information; and the processor 71 is configured to perform interleaving processing on the to-be-sent data by using the selected interleaver, and send, to the receiving device on the time-frequency resource by using the transmitter 73, the interleaved to-be-sent data that carries the selected time synchronization code.

In the sending device provided in this embodiment of the present invention, to-be-sent data is sent by selecting a time synchronization code and a corresponding interleaver for the data, and it is unnecessary to first request a resource to establish link synchronization between devices in each data sending process, thereby sending the data in an authorization-free manner, which effectively reduces signaling overheads, improves transmission efficiency, and reduces a time delay.

Optionally, the sending device further includes a receiver 75 connected to the bus, and the processor 71 is specifically configured to:

acquire, by using a system broadcast message received by the receiver 75 or a dedicated signaling notification received by the receiver 75, or according to a pre-configuration of the processor 71, the time-frequency resource to be used by the to-be-sent data; and acquire, by using a system broadcast message received by the receiver 75 or a dedicated signaling notification received by the receiver 75, or according to a pre-configuration of the processor 71, the interleaver information to be used by the to-be-sent data.

Optionally, the processor 71 is specifically configured to select the time synchronization code and the interleaver according to identifier information of the sending device and the interleaver information, where the identifier information of the sending device corresponds to a unique interleaver and a unique time synchronization code. The identifier information includes one or more of a cell radio network temporary identifier C-RNTI of the sending device, a Media Access Control MAC address acquired in a process of establishing a connection by the sending device and the receiving device, time information of the to-be-sent data, and an identifier of a fixed time-frequency resource to be used by the to-be-sent data. In this way, on a side of the sending device, the time synchronization code or the interleaver is selected according to the identifier information of the sending device, so that different sending devices select different interleavers to perform interleaving processing on data, and collision during data sending can also be effectively avoided.

Further, the to-be-sent data includes the identifier information of the sending device. In this way, on a side of the receiving device, data of different sending devices can be identified by using different interleavers, corresponding de-interleaving processing is performed, and a possibility that collision occurs in a data transmission process is reduced.

Optionally, the to-be-sent data further includes a guard time interval, so that the receiving device performs, after the guard time interval, de-interleaving processing on next sent data to be received, which avoids interference to a next frame.

An embodiment of the present invention provides a receiving device, including: at least one processor 81, memory 82, receiver 83, and bus 84, where the at least one processor 81, memory 82, and receiver 83 are connected and communicate with each other by using the bus 84, and the memory 82 is configured to store program code.

Figure 8:
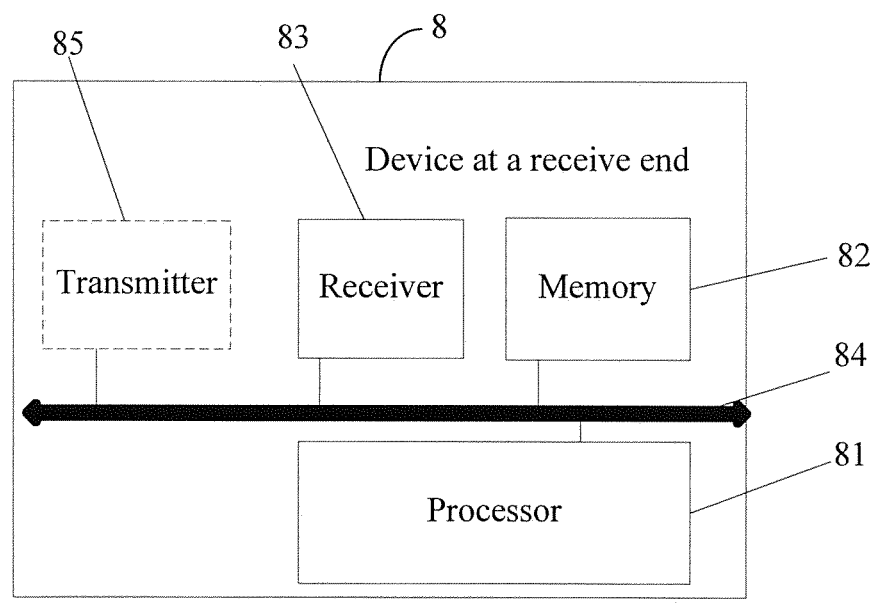
FIG. 8 is a schematic structural diagram of a receiving device according to another embodiment of the present invention.
Figure 9:
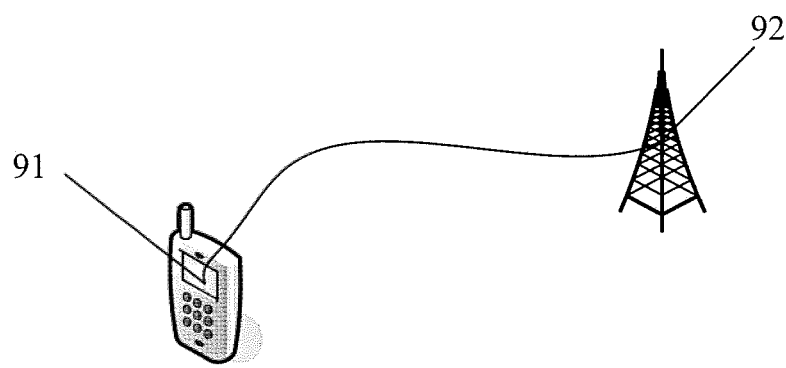
FIG. 9 is a schematic structural diagram of a data transmission system according to an embodiment of the present invention.

The bus 84 may be an industry standard architecture (Industry Standard Architecture, ISA for short) bus, a peripheral component interconnect (Peripheral Component Interconnect, PCI for short) bus, an extended industry standard architecture (Extended Industry Standard Architecture, EISA for short) bus, or the like. The bus 84 may be classified into an address bus, a bus, a control bus, and the like, and is represented by only one thick line in FIG. 8 for ease of representation, which however does not indicate that there is only one bus or one type of buses.

The memory 82 is configured to store executable program code, where the program code includes a computer operation instruction. The memory 82 may include a high-speed RAM memory, or may further include a non-volatile memory (non-volatile memory), for example, at least one magnetic disk storage.

The processor 81 may be a central processing unit (Central Processing Unit, CPU for short), or an application specific integrated circuit (Application Specific Integrated Circuit, ASIC for short), or one or more integrated circuits that are configured to implement this embodiment of the present invention.

The receiver 83 is mainly configured to implement communication between a sending device and the receiving device in this embodiment.

The processor 81 is further configured to invoke the program code in the memory 82, to perform the following operations.

The receiver 83 is configured to receive, on a pre-configured time-frequency resource, sent data that is sent by a sending device and that carries a time synchronization code; and the processor 81 is configured to invoke, according to pre-configured interleaver information, an interleaver corresponding to the time synchronization code to de-interleave the sent data, where the interleaver information includes a correspondence between an interleaver and a time synchronization code, and there is a one-to-one correspondence between a time synchronization code and an interleaver.

Optionally, the receiving device further includes a transmitter 85 connected to the bus 84, and the transmitter 85 is configured to: notify, by using a system broadcast message or a dedicated signaling notification, the sending device of a time-frequency resource allocated to the sending device; and notify the sending device of the interleaver information by using a system broadcast message or a dedicated signaling notification.

In the receiving device provided in this embodiment of the present invention, to-be-sent data that is sent by a sending device and that carries a time synchronization code having a one-to-one correspondence with an interleaver is received, and it is unnecessary to first request a resource by using the sending device to establish link synchronization between devices in each data transmission process, thereby sending the data in an authorization-free manner, which effectively reduces signaling overheads, improves transmission efficiency, and reduces a time delay.

Further, the processor 81 is further configured to: when the sent data includes identifier information of the sending device, determine, according to the identifier information of the sending device, the sending device corresponding to the sent data.

In this way, on a side of the receiving device, data of different sending devices can be identified by using different interleavers, corresponding de-interleaving processing is performed, and a possibility that collision occurs in a data transmission process is reduced.

Further, optionally, when the sent data further includes a guard time interval, the processor 81 is further configured to perform, after the guard time interval, de-interleaving processing on next sent data to be received, which avoids interference to a next frame.

An embodiment of the present invention provides a data transmission system 9, configured to implement the data transmission methods provided in the foregoing method embodiments, and including a receiving device 91 and a sending device 92 that are provided in the foregoing embodiments.

In the data transmission system provided in this embodiment of the present invention, to-be-sent data is sent by selecting a fixed time synchronization code and a corresponding interleaver for the data, and it is unnecessary to first request a resource to establish link synchronization between devices in each data sending process, thereby sending the data in an authorization-free manner, which effectively reduces signaling overheads, improves transmission efficiency, and reduces a time delay. In addition, when the to-be-sent data includes identifier information of a sending device, on a side of a receiving device, data of different sending devices can be identified by using different interleavers, corresponding de-interleaving processing is performed, and a possibility that collision occurs in a data transmission process is reduced.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A data transmission method, comprising:
    acquiring, by a sending device, interleaver information that is to be used by to-be-sent data, wherein the interleaver information comprises a correspondence between a plurality of interleavers and a plurality of time synchronization codes, and there is a one-to-one correspondence between each one of the plurality of time synchronization codes and a respective one of the plurality of interleavers;
    selecting, by the sending device, a first time-frequency resource from multiple time-frequency resources that are preconfigured in the sending device;
    acquiring, by the sending device, the to-be-sent data, wherein the to-be-sent data includes identifier information of the sending device;
    selecting, by the sending device, a time synchronization code from the plurality of time synchronization codes;
    performing, by the sending device, interleaving processing on the to-be-sent data by using the respective one of the plurality of interleavers in one-to-one correspondence with the selected time synchronization code; and
    sending, by the sending device, the interleaved to-be-sent data and the selected time synchronization code to a receiving device on the first time-frequency resource.

2. The method according to claim 1, wherein selecting a time synchronization code from the plurality of time synchronization codes comprises:
    selecting the time synchronization code according to identifier information of the sending device and the interleaver information, wherein the identifier information of the sending device corresponds to a unique time synchronization code.

3. The method according to claim 2, wherein the identifier information comprises one or more of:
    a cell radio network temporary identifier (C-RNTI) of the sending device,
    a Media Access Control (MAC) address acquired in a process of establishing a connection by the sending device and the receiving device,
    a frame to be used by the to-be-sent data;
    a sub-frame to be used by the to-be-sent data;
    a slot to be used by the to-be-sent data; and
    an identifier of a fixed time-frequency resource to be used by the to-be-sent data.

4. The method according to claim 1, wherein acquiring, by a sending device, interleaver information that is to be used by to-be-sent data comprises:
    acquiring, by the sending device by using a system broadcast message or a dedicated signaling notification, or according to a pre-configuration, the interleaver information to be used by the to-be-sent data.

5. The method according to claim 1, wherein the to-be-sent data further comprises a guard time interval.

6. The method according to claim 1, wherein, before sending the interleaved to-be-sent data and the selected time synchronization code, it is unnecessary to first request a resource to establish link synchronization between devices in each data sending process.

7. A data transmission method, comprising:
    receiving, by a receiving device, on a pre-configured time-frequency resource, sent data and a time synchronization code that are sent by a sending device, wherein the sent data includes identifier information of the sending device, wherein the time-frequency resource is the same as a first time-frequency resource that is selected by the sending device from multiple time-frequency resources that are preconfigured in the sending device;
    invoking, by the receiving device, according to pre-configured interleaver information, an interleaver corresponding to the received time synchronization code to de-interleave the sent data, wherein the interleaver information comprises a correspondence between a plurality of interleavers and a plurality of time synchronization codes, and there is a one-to-one correspondence between each one of the plurality of time synchronization codes and a respective one of the plurality of interleavers, and the invoked interleaver is the respective one of the plurality of the plurality of interleavers in one-to-one correspondence with the received time synchronization code; and
    determining, by the receiving device, the sending device corresponding to the sent data.

8. The method according to claim 7, wherein:
    when the sent data comprises identifier information of the sending device, the identifier information of the sending device corresponds to a unique interleaver and a unique time synchronization code; and
    after invoking, according to pre-configured interleaver information, an interleaver corresponding to the time synchronization code to de-interleave the sent data, the method further comprises:
    determining, by the receiving device according to the identifier information of the sending device, the sending device corresponding to the sent data.

9. The method according to claim 8, wherein the identifier information comprises one or more of: a cell radio network temporary identifier (C-RNTI) of the sending device, a Media Access Control (MAC) address acquired in a process of establishing a connection by the sending device and the receiving device, time information of the sent data, and an identifier of a fixed time-frequency resource used by the sent data.

10. The method according to claim 7, wherein before receiving, by a receiving device on a pre-configured time-frequency resource, sent data and a time synchronization code that are sent by a sending device, the method comprises:
   notifying, by the receiving device, the sending device of the interleaver information by using a system broadcast message or a dedicated signaling notification.

11. The method according to claim 7, wherein when the sent data further comprises a guard time interval, the method further comprises:
   performing, after the guard time interval, de-interleaving processing on next sent data to be received.

12. The method according to claim 7, wherein, before determining the sending device corresponding to the sent data, it is unnecessary to first request a resource by using the sending device to establish link synchronization between devices in each data sending process.

13. A sending device, comprising:
   a processor, a memory configured to store program code, a transmitter and a bus, wherein the processor, the memory, and the transmitter are configured to communicate with each other by using the bus; and
   wherein the processor is configured to:
      acquire interleaver information that is to be used by to-be-sent data, wherein the interleaver information comprises a correspondence between a plurality of interleavers and a plurality of time synchronization codes, and there is a one-to-one correspondence between each one of the plurality of time synchronization codes and a respective one of the plurality of interleavers;
      select a first time-frequency resource from multiple time-frequency resources that are preconfigured in the sending device;
      acquire the to-be-sent data, wherein the to-be-sent data includes identifier information of the sending device;
      select a time synchronization code from the plurality of time synchronization codes;
      perform interleaving processing on the to-be-sent data by using the respective one of the plurality of interleavers in one-to-one correspondence with the selected time synchronization code; and
      send, using the transmitter, the interleaved to-be-sent data and the selected time synchronization code to a receiving device on the first time-frequency resource.

14. The sending device according to claim 13, wherein the processor is configured to:
   select the time synchronization code according to identifier information of the sending device and the interleaver information, wherein the identifier information of the sending device corresponds to a unique time synchronization code.

15. The sending device according to claim 14, wherein the identifier information comprises one or more of:
   a cell radio network temporary identifier (C-RNTI) of the sending device, or
   a Media Access Control (MAC) address acquired in a process of establishing a connection by the sending device and the receiving device, or
   a frame to be used by the to-be-sent data; or
   a sub-frame to be used by the to-be-sent data; or
   a slot to be used by the to-be-sent data; or
   an identifier of a fixed time-frequency resource to be used by the to-be-sent data.

16. The sending device according to claim 13, further comprising:
   a receiver coupled to the bus; and
   wherein the processor is configured to acquire, by using a system broadcast message received by the receiver or a dedicated signaling notification received by the receiver, or according to a pre-configuration of the processor, the interleaver information to be used by the to-be-sent data.

17. The sending device according to claim 13, wherein the to-be-sent data further comprises a guard time interval.

18. A receiving device, comprising:
   a processor, a memory configured to store program code, a receiver and a bus, wherein the processor, the memory, and the receiver are configured to communicate with each other by using the bus;
   wherein the receiver is configured to receive, on a pre-configured time-frequency resource, sent data and a time synchronization code that are sent by a sending device, wherein the sent data includes identifier information of the sending device, wherein the time-frequency resource is the same as a first time-frequency resource that is selected by the sending device from multiple time-frequency resources that are preconfigured in the sending device;
   wherein the processor is configured to invoke, according to pre-configured interleaver information, an interleaver corresponding to the received time synchronization code to de-interleave the sent data, wherein the interleaver information comprises a correspondence between a plurality of interleavers and a plurality of time synchronization codes, and there is a one-to-one correspondence between each one of the plurality of time synchronization codes and a respective one of the plurality of interleavers, and the invoked interleaver is the respective one of the plurality of the plurality of interleavers in one-to-one correspondence with the received time synchronization code; and
   the processor is configured to determine the sending device corresponding to the sent data.

19. The receiving device according to claim 18, further comprising:
   a transmitter coupled to the bus and configured to notify the sending device of the interleaver information by using a system broadcast message or a dedicated signaling notification.

20. The receiving device according to claim 18, wherein the processor is further configured to:
   determine, when the sent data comprises identifier information of the sending device and the identifier information of the sending device corresponds to a unique interleaver and a unique time synchronization code, the sending device corresponding to the sent data according to the identifier information of the sending device.

21. The receiving device according to claim 18, wherein when the sent data further comprises a guard time interval, the processor is further configured to:
   perform, after the guard time interval, de-interleaving processing on next sent data to be received.

* * * * *